United States Patent
Fenouillet-Beranger et al.

(10) Patent No.: US 9,391,057 B2
(45) Date of Patent: Jul. 12, 2016

(54) INTEGRATED CIRCUIT ON SOI COMPRISING A TRANSISTOR PROTECTING FROM ELECTROSTATIC DISCHARGES

(71) Applicants: Commissariat a l'energie atomique et aux energies alternatives, Paris (FR); STMicroelectronics SA, Montrouge (FR)

(72) Inventors: Claire Fenouillet-Beranger, Grenoble (FR); Pascal Fonteneau, Theys (FR)

(73) Assignees: Commissariat a l'energie atomique et aux energies alternatives, Paris (FR); STMicroelectronics SA, Montrouge (FR)

(*) Notice: Subject to any disclaimer, the term of this patent is extended or adjusted under 35 U.S.C. 154(b) by 78 days.

(21) Appl. No.: 14/261,757

(22) Filed: Apr. 25, 2014

(65) Prior Publication Data
US 2014/0319648 A1 Oct. 30, 2014

(30) Foreign Application Priority Data
Apr. 26, 2013 (FR) ...................... 13 53811

(51) Int. Cl.
*H01L 29/74* (2006.01)
*H01L 27/02* (2006.01)
*H01L 27/12* (2006.01)

(52) U.S. Cl.
CPC ........ *H01L 27/0248* (2013.01); *H01L 27/0259* (2013.01); *H01L 27/0296* (2013.01); *H01L 27/1207* (2013.01)

(58) Field of Classification Search
CPC ............ H01L 27/0259; H01L 27/0296; H01L 27/1207
See application file for complete search history.

(56) References Cited

U.S. PATENT DOCUMENTS

| 7,081,662 B1 | 7/2006 | Lee et al. |
| 2005/0002139 A1* | 1/2005 | Yeh ..................... H01L 27/0259 361/43 |
| 2007/0007545 A1 | 1/2007 | Salcedo et al. |

(Continued)

FOREIGN PATENT DOCUMENTS

| EP | 2573808 | 3/2013 |
| FR | 1256802 | 3/1961 |

OTHER PUBLICATIONS

Dray et al., "ESD Design Challenges in 28nm Hybrid FDSOI/Bulk Advanced CMOS Process," Electrical Overstress/Electrostatic Discharge Symposium (EOS/ESD), 34$^{th}$ IEEE, Sep. 9, 2012, pp. 1-7 (XP032254924).

(Continued)

*Primary Examiner* — Daniel Whalen
(74) *Attorney, Agent, or Firm* — Occhiuti & Rohlicek LLP (57) ABSTRACT

An integrated circuit includes first and second electronic components, a buried UTBOX insulating layer, first and second ground planes plumb with the first and second electronic components, first and second wells, first and second biasing electrodes making contact with the first and second wells and with the first and second ground planes, a third electrode making contact with the first well, a first trench isolation separating the first and third electrodes and extending through the buried insulating layer as far as into the first well, and a second trench isolation that isolates the first electrode from the first component, and that does not extend as far as the interface between the first ground plane and the first well.

8 Claims, 7 Drawing Sheets

(56) References Cited

U.S. PATENT DOCUMENTS

2009/0154037 A1 6/2009 Voldman
2014/0015052 A1* 1/2014 Fenouillet-
 Beranger ............ H01L 27/1203
 257/348

OTHER PUBLICATIONS

Search Report, French Application No. 1353811, mailed Dec. 18, 2013 (2 pages).

* cited by examiner

INTEGRATED CIRCUIT ON SOI COMPRISING A TRANSISTOR PROTECTING FROM ELECTROSTATIC DISCHARGES

RELATED APPLICATIONS

Under 35 USC 119, this application claims the benefit of the Apr. 26, 2013 priority date of French application FR 1353811, the contents of which are herein incorporated by reference.

FIELD OF INVENTION

The invention relates to integrated circuits, and in particular to integrated circuits produced on a silicon-on-insulator (SOI) substrate.

BACKGROUND

SOI technology consists in separating a thin silicon layer (a few nanometers in thickness) on a silicon substrate by a relatively thick (a few tens of nanometers in thickness, as a general rule) insulating layer.

Integrated circuits produced in SOI technology have a certain advantages. Such circuits generally have lower power consumption for an equivalent performance. Such circuits also have lower parasitic capacitances, thereby allowing switching speeds to be improved.

In addition, the phenomenon of latch up encountered in bulk technology MOS transistors may be prevented. Such circuits therefore prove to be particularly suitable for SoC or MEMS applications.

It has also been observed that SOI integrated circuits are less sensitive to the effects of ionizing radiation and thus prove to be more reliable in applications where such radiation may cause malfunctions, especially in space applications.

SOI integrated circuits may notably comprise active SRAM memory or logic gates.

Many studies have focused on reducing the static consumption of logic gates while increasing their switching speed. Certain integrated circuits currently being developed incorporate both low-consumption logic gates and fast-access logic gates. To generate these two types of logic gates in a given integrated circuit, the threshold voltage of certain transistors of the fast-access logic gates is reduced and the threshold voltage of other transistors of the low-consumption logic gates is increased.

In bulk technology, modulation of the threshold voltage level of transistors of the same type is achieved by modifying the doping level in their channels. However, in fully depleted silicon-on-insulator technology ("FDSOI"), the doping of the channel is almost non-existent ($10^{15}$ cm$^{-3}$). Thus, the doping level of the channel of the transistors cannot be made to vary substantially. This prevents the threshold voltages from being modified in the conventional way.

A known way to produce transistors of the same type with different threshold voltages is to use different gate materials in these transistors. However, in practice producing such an integrated circuit proves to be technically difficult and economically prohibitive.

Another known way to use FDSOI technology to produce different transistors with different threshold voltages is to place an electrically biased ground plane between a thin insulating oxide layer and the silicon substrate. By adjusting the doping of the ground planes and their biases, it is possible to define a range of threshold voltages for these various transistors. It is thus possible to produce transistors with a low threshold voltage (typically 400 mV), termed "LVT" (for "Low Voltage Threshold") transistors, transistors with a high threshold voltage (typically 550 mV), termed "HVT" (for "High Voltage Threshold") transistors, and transistors with an intermediate threshold voltage (typically 450 mV), termed "SVT" (for "Standard Voltage Threshold") transistors.

For these various transistors to function, it is necessary to isolate them electrically from each other. Therefore, the transistors are generally encircled by trench isolations (denoted by the acronym "STI" for "Shallow Trench Isolation") that extend as far as their wells.

Such integrated circuits also include devices to protect them from accidental electrostatic discharges ("ESD") that may deteriorate these transistors. A particularly useful ESD protection device is semiconductor-controlled rectifier (SCR). An SCT is able to handle a high discharge current density. In addition, its turn-on trigger can be finely tuned.

However, SCRs have drawbacks. Specifically, SCRs have a relatively slow switching speed before discharge current is conducted. This results in a relatively large transient overvoltage amplitude. Additionally, SCTs are sensitive to parasitic turn-on, in particular if currents are injected near the device.

SUMMARY

The invention aims to solve one or more of these drawbacks or to obtain an optimal compromise between switching speed, transient overvoltage amplitude and sensitivity to parasitic turn-on. The invention aims to obtain such a result without excessively decreasing integration density.

In one aspect, the invention features a manufacture comprising an integrated circuit arranged on and in a p-doped substrate. Such an integrated circuit has a bipolar transistor for protection from electrostatic discharges, an n-doped first semiconductor element, a p-doped well, a deep buried n-doped well, an n-doped first implanted zone, a p-doped second implanted zone, a p-doped third implanted zone, a fourth implanted zone, a first trench isolation, a second trench isolation, and a third trench isolation.

The n-doped first implanted zone is arranged on the first semiconductor element and forms, with the n-doped first semiconductor element, a base of the bipolar transistor, The p-doped second implanted zone, which forms an emitter of the bipolar transistor, is arranged on the n-doped first semiconductor element.

The p-doped well is arranged in the deep buried n-doped well, under the n-doped first implanted zone and the p-doped second implanted zone. The p-doped well makes contact with a bottom of the n-doped first semiconductor element.

The p-doped third implanted zone is arranged on the p-doped well and forms, with the p-doped well, a collector of the bipolar transistor.

The fourth implanted zone is arranged in a top part of the well.

The first trench isolation separates the first and second implanted zones, and extends into the n-doped first semiconductor element by an amount equal to a first depth. The first trench isolation extends into the n-doped first semiconductor element without reaching the bottom of the n-doped first semiconductor element.

The second trench isolation encircles the bipolar transistor and extends as far as below the n-doped first semiconductor element. The third trench isolation separates the third and fourth implanted zones and extends to a depth equal to the first depth.

In some embodiments, the p-doped second implanted zone is separated from the p-doped well by a thickness of the n-doped first semiconductor element. The thickness is between 20 and 150 nm.

In other embodiments, the p-doped well makes contact with an entirety of the bottom of the n-doped first semiconductor element.

In yet other embodiments, the first and second implanted zones extend into the first semiconductor element to a depth larger than a depth of the first trench isolation.

Additional embodiments include those in which the first trench isolation extends to a depth between 5 and 50 nm into the n-doped first semiconductor element.

Other embodiments further include first and second electronic components, a buried UTBOX insulating layer, and first and second ground planes. In these embodiments, the buried UTBOX insulating layer is arranged under the first and second electronic components, and plumb with the first and second electronic components. The first, second, and third implanted zones pass through the buried insulating layer. The first and second ground planes are arranged plumb with the first and second electronic components under the buried insulating layer. The first semiconductor element forms the first ground plane. The top part of the well forms the second ground plane. The p-doped second implanted zone is suitable for connection to a first biasing voltage, and the third implanted zone is suitable for connection to a second biasing voltage that differs from the first.

Among these embodiments are those in which the n-doped first implanted zone and the p-doped second implanted zone are arranged on either side of the transistor.

In yet other embodiments, the second implanted zone is arranged between the first and third implanted zones.

In another aspect, the invention features a manufacture comprising an integrated circuit. Such an integrated circuit has first and second electronic components, a buried UTBOX insulating layer, first and second ground planes plumb with the first and second electronic components, first and second wells, first and second biasing electrodes making contact with the first and second wells and with the first and second ground planes, a third electrode making contact with the first well, a first trench isolation separating the first and third electrodes and extending through the buried insulating layer as far as into the first well, and a second trench isolation that isolates the first electrode from the first component, and that does not extend as far as the interface between the first ground plane and the first well.

In one aspect, the invention features an integrated circuit arranged on and in a p-doped substrate, comprising a bipolar transistor for protecting from electrostatic discharges, including an n-doped first semiconductor element; an n-doped first implanted zone arranged on the first semiconductor element and forming, with the first semiconductor element, a base of the bipolar transistor, the p-doped second implanted zone forming an emitter of the bipolar transistor, the zone being arranged on the first semiconductor element; a p-doped well arranged in a deep buried n-doped well, under the first and second implanted zones and making contact with a bottom side of the first semiconductor element; a p-doped third implanted zone arranged on the well forming, with the well, the collector of the bipolar transistor; a fourth implanted zone arranged in the top part of the well; a first trench isolation separating the first and second implanted zones and extending into the first semiconductor element without reaching the bottom of this element; a second trench isolation encircling the bipolar transistor and extending as far as below the first semiconductor element; and a third trench isolation separating the third and fourth implanted zones and extending to the same depth as the first trench isolation.

In some embodiments, the first implanted zone is separated from the well by a thickness of the first semiconductor element that is between 20 nm and 150 nm.

In other embodiments, the well makes contact with the entirety of the bottom side of the first semiconductor element.

In yet other embodiments, the first and second implanted zones extend into the first semiconductor element to a depth larger than the depth of the first trench isolation.

In some embodiments, the first trench isolation extends to a depth between 5 and 50 nm into the first semiconductor element.

Also included are embodiments that further include first and second electronic components; a buried UTBOX insulating layer arranged under and plumb with the electronic components, the buried insulating layer being passed through by the first to third implanted zones; and first and second ground planes arranged plumb with the first and second electronic components, respectively, under the buried insulating layer, the first semiconductor element forming the first ground plane, a top part of the well forming the second ground plane, the second implanted zone being suitable for connection to a first biasing voltage, and the third implanted zone being suitable for connection to a second biasing voltage that differs from the first voltage. Among these embodiments are those in which the first and second implanted zones are arranged on either side of the transistor.

In additional embodiments, the second implanted zone is arranged between the first and third implanted zones.

These and other features of the invention will be apparent from the following detailed description and the accompanying figures, in which:

DETAILED DESCRIPTION

Figure 1:
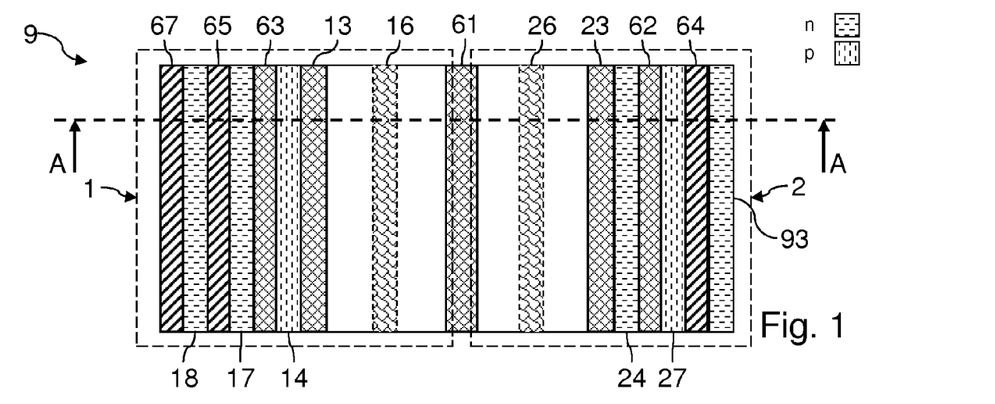
FIG. 1 is a schematic top view of an integrated-circuit portion according to a first variant of a first embodiment of the invention.
Figure 2:
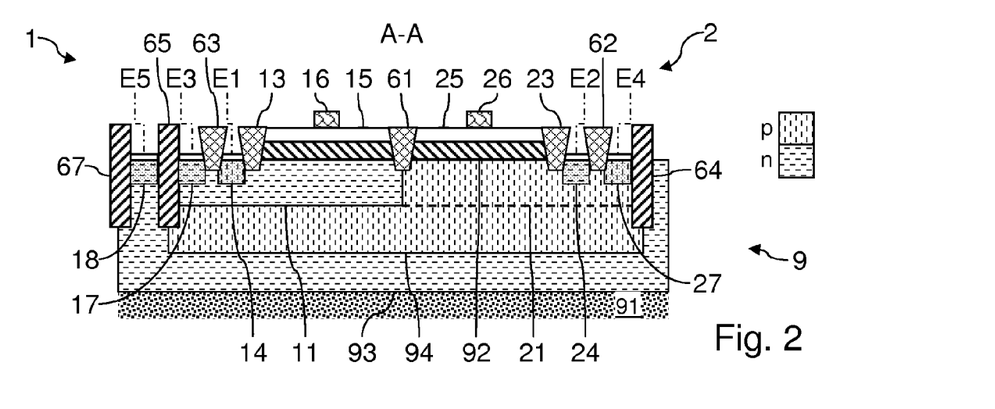
FIG. 2 illustrates a cross-sectional view of the integrated circuit in FIG. 1.

FIG. 1 is a schematic top view of a portion of an integrated circuit 9 fabricated on SOI, according to a first variant of a first embodiment. FIG. 2 is a cross-sectional view of this integrated circuit 9 in the plane A-A. The integrated circuit 9 comprises a cell containing first and second electronic components 1, 2. The first and second electronic components 1, 2 are produced in a layer of a semiconductor, called the active layer, formed on an insulating layer 92. The insulating layer 92 is formed plumb with a p-doped semiconductor substrate 91.

In the embodiment described herein, the first and second electronic components 1, 2 are first and second FDSOI field-effect transistors. The first and second electronic components 1, 2 can also be field-effect diodes (FEDs), field-effect resistors (FERs), capacitors or Z2-FETs.

The first and second transistors 1, 2 are, for example, pMOS and nMOS transistors, respectively. The transistors are generally aligned in a row of cells, each including an nMOS transistor and a pMOS transistor. The nMOS transistors of the various cells are then aligned.

The first and second transistors 1, 2 each comprise a source, a drain, a channel, and a gate multilayer produced plumb with the channel. The source, drain and channel of the first and second transistors 1, 2 are produced in first and second active semiconductor layers 15, 25, respectively as schematically illustrated. The first and second transistors 1, 2 comprise respective gate multilayers 16 and 26 arranged on the active semiconductor layers 15, 25, respectively, plumb with the channel. In order to simplify the drawings, the detailed structure of the active layers has not been shown. The transistors of the active layer may comprise a channel made of a weakly-doped semiconductor having a dopant concentration substantially equal to the dopant concentration of the substrate 91. The first and second transistors 1, 2 also comprise respective source and drain electrodes. Since these electrodes are known in the art, they have been omitted from the figure for clarity.

First and second semiconductor ground planes 11, 21 are formed plumb with the first and second transistors 1, 2 respectively under the buried insulating layer 92. The first ground plane 11 is n-doped and the second ground plane 21 is p-doped.

Implanted semiconductor zones 17, 27 bias respective first and second ground planes 11, 21. The implanted zones 17, 27 are n-doped and p-doped, respectively. Preferably, the implanted zones 17, 27 are n+-doped and p+-doped, respectively. The ground planes 11, 21 may be biased by way of a biasing circuit, details of which are known in the art and therefore need not be shown. The implanted zones 17, 27 are coplanar to the ground planes 11, 21. The term "coplanar" is understood to mean that it is possible to define a plane parallel to the layer 92 and passing through the zones in question.

Thus, the implanted zones 17, 27 allow both the ground planes 11, 21 to be biased and triggers to be formed for a device for protecting from electrostatic discharges.

First and second implanted semiconductor zones 14, 24 are produced in the first and second ground planes 11, 21, respectively. The implanted zones 14, 24 are p-doped and n-doped, respectively. Preferably, the implanted zones 14, 24 are p+-doped and n+-doped, respectively. The implanted zones 14, 24 are coplanar to the ground planes 11, 21 and to the implanted zones 17, 27.

The implanted zones 14, 24 will serve as anode and cathode, respectively, in the protection from electrostatic discharges.

Metal contacts may be arranged, after silicidation, directly on each of the implanted zones 14, 17, 24, 27, 18 in order to allow electrical contact to be made to each of them. Advantageously, the implanted zones 14, 17, 24, 27, 18 each have a dopant concentration at least fifty times, or one hundred times higher than the dopant concentration of the well 94. For example, the implanted zones 14, 17, 24, 27, 18 have dopant concentrations advantageously higher than or equal to $5 \times 10^{18}$ $cm^{-3}$ and, preferably, comprised between $10^{19}$ $cm^{-3}$ and $10^{21}$ $cm^{-3}$. These dopant concentrations are, for example, substantially equal to the dopant concentrations of the source or the drain of the transistors 1, 2.

The transistor 1 is arranged between the transistor 2 and the implanted zones 14, 17. Similarly, the transistor 2 is arranged between the transistor 1 and the implanted zones 24, 27. The well 94 extends laterally under the implanted zones 14, 17, 24, 27.

A semiconductor well 94 is formed plumb with and making contact with the ground planes 11, 21. The well 94 is p-doped. The well 94 is advantageously produced in an n-type deep buried well 93. The deep buried well 93 forms a separation between the well 94 and the p-doped substrate 91. An implanted biasing zone 18, which in the illustrated embodiment is n+-doped and coplanar with the ground planes 11, 21 and the implanted zones 14, 24, is produced in the top part of the well 93 in order to apply a voltage level E5 to the well 93. A biasing contact, not illustrated, may be provided for biasing the substrate 91, for example to a ground voltage Gnd.

The buried insulating layer 92 electrically insulates the transistors 1, 2 from their ground plane, from the wells, and from the substrate 91. The buried insulating layer 92 formed plumb with the transistors is here an ultra-thin buried oxide (UTBOX) layer. Thus, control of the bias of the ground planes 11, 21, which are also called back gates, allows the respective threshold voltages of the transistors 1, 2 to be modulated. The insulating layer 92, for example, has a thickness smaller than or equal to 60 nm, smaller than or equal to 50 nm, or even smaller than or equal to 20 nm. The insulating layer 92 may be produced from silicon oxide.

In the illustrated embodiment, the circuit 9 comprises deep trench isolations 64, 65, 67 that extend through the insulating layer 92, advantageously as far as a given depth corresponding to the depth of the well 94, without reaching the bottom of the well. The well 94 may have a dopant concentration comprised between $10^{16}$ cm$^{-3}$ and $10^{18}$ cm$^{-3}$. The ground planes 11, 21 may have dopant concentrations between $10^{18}$ cm$^{-3}$ and $10^{19}$ cm$^{-3}$. The well 94 may extend as far as a depth smaller than 1 μm and, preferably, less than or equal to 700 nm.

The circuit 9 furthermore has trench isolations 61, 13, 23, 63 and 62 extending through the insulating layer 92, advantageously as far as a given depth, corresponding to the depth of the ground planes 11, 21, without reaching the bottom of the well 94.

The trench isolations 61, 13 are produced on the periphery of the transistor 1. The trench isolations 61, 23 are produced on the periphery of the transistor 2. The trench isolations 61, 13 extend in a depth direction through the insulating layer 92, as far as into the ground plane 11. The trench isolations 61, 13 do not reach the well 94. The trench isolations 61, 23 extend in the depth direction through the insulating layer 92, as far as into the ground plane 21. The trench isolations 61, 13 do not reach the well 94. Thus, the ground planes 11, 21 make contact under the trench 61. The implanted zone 14 is produced between the trenches 13, 63. The implanted zone 24 is produced between the trenches 23, 63. The implanted zone 17 is produced between the trench isolations 63, 65. The implanted zone 27 is produced between the trench isolations 62, 64. The implanted zone 18 is produced between the trench isolations 65, 67. The deep trench isolations 65, 67 are produced to electrically isolate the implanted zone 18 from the well 94 and from the ground plane 11.

The ground plane 11 ensures a separation between the implanted zones 14, 17 plumb with the trench isolation 63. The ground plane 21 ensures a separation between the implanted zones 24, 27 plumb with the trench isolation 62. The ground plane 11 ensures a separation between the well 94 and the implanted zones 14, 17. The ground plane 21 ensures a separation between the well 94 and the implanted zones 24, 27.

The trench isolation 63 electrically isolates the implanted zones 14, 17. The trench isolation 62 electrically isolates the implanted zones 24, 27.

The trench isolations 13, 23 allow the isolation between the transistors 1, 2 and their implanted zones 14, 24 to be improved while making it possible to bias the ground planes 11, 21.

The implanted zones 14, 24, 17, 27 are produced laterally relative to the transistors 1, 2. The implanted zone 14 is biased to a first voltage level E1, the implanted zone 24 is biased to a second voltage level E2, the implanted zone 17 is biased to a third voltage level E3, and the implanted zone 27 is biased to a fourth voltage level E4.

A device for protecting from electrostatic discharges is included in the integrated circuit 9 plumb with the transistors 1, 2. The protection from electrostatic discharges aims to provide protection from discharges between the voltage levels E1 and E2.

Figure 3:
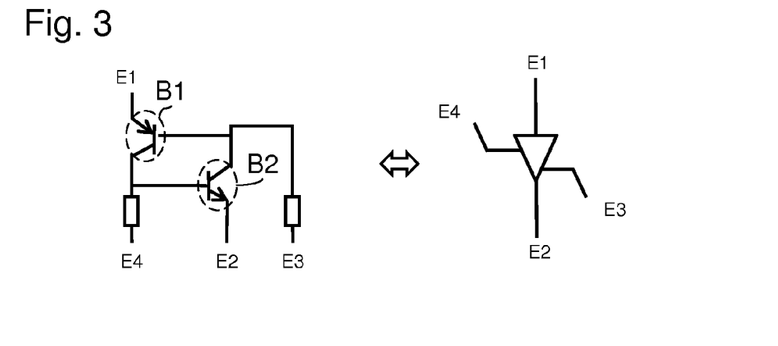
FIG. 3 is an equivalent circuit diagram showing the protection from electrostatic discharges provided by the circuit.

FIG. 3 is a circuit diagram of a protecting device implemented as a semiconductor controlled rectifier (SCR). First and second bipolar transistors B1, B2 are formed, the first bipolar transistor B1 being a pnp transistor and the second bipolar transistor B2 being an npn transistor.

For the first bipolar transistor B1, the emitter is formed by the implanted zone 14, and is at the potential E1, the base is formed by the ground plane 11, and is at the potential E3; and the collector is formed by the well 94 and the ground plane 21, and is at the potential E4.

For the second bipolar transistor B2, the emitter is formed by the implanted zone 24, and is at the potential E2, the base is formed by the well 94 and the ground plane 21, and is at the potential E4, and the collector is formed by the ground plane 11, and is at the potential E3.

A thyristor potentially having a double trigger is thus formed, between the potentials E1 and E2, it being possible to apply the signals E3 and E4 to the two triggers of this thyristor.

Figure 4:
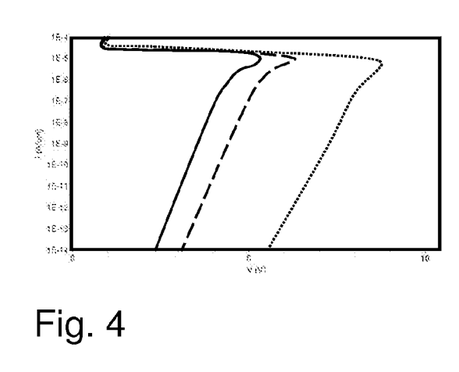
FIG. 4 is a graph showing discharge voltage/current characteristics during a discharge for the circuit in FIG. 1 and for another circuit taken as a reference, respectively.
Figure 5:
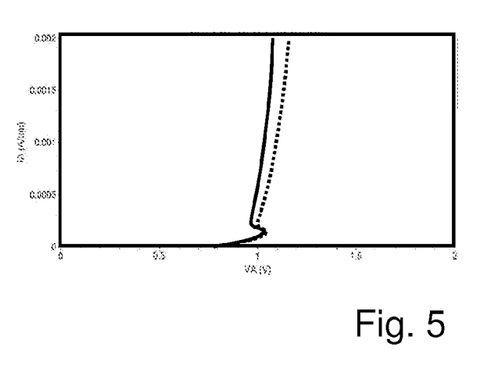
FIG. 5 is a graph showing trigger voltage/current characteristics during a discharge for the circuit in FIG. 1 and for another circuit taken as a reference, respectively.
Figure 6:
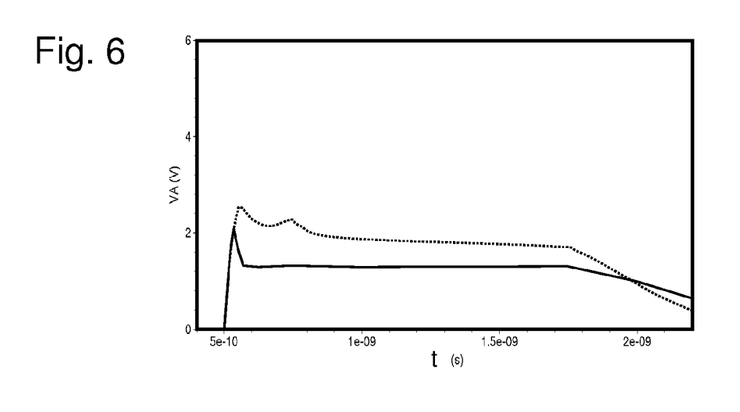
FIG. 6 is a graph showing the trigger voltage as a function of time during a discharge for the circuit in FIG. 1 and for another circuit taken as a reference, respectively.

The characteristics in FIGS. 4 to 6 allow the respective performance of an integrated circuit according to the first embodiment of the invention and a reference integrated circuit described in FIG. 2 of document FR 12 56802 to be compared.

FIG. 4 is a graph showing voltage/current characteristics during a blocking mode discharge, without use of the trigger. The solid line corresponds to an integrated circuit according to the first embodiment, with trench isolations 13, 23, 62, 63 and 61 extending 0 nm under the insulating layer 92. The dashed line corresponds to an integrated circuit according to the first embodiment, with trench isolations 13, 23, 62, 63 and 61 extending 20 nm under the insulating layer 92, i.e. 20 nm under the interface between the insulating layer 92 and the ground planes 11, 21. The dotted line corresponds to a reference integrated circuit.

FIG. 5 is a graph showing voltage/current characteristics during a discharge using the trigger E3.

FIG. 6 is a graph illustrating the trigger voltage as a function of time during a discharge. The solid lines correspond to trench isolations 13, 23, 62, 63 and 61 extending 20 nm under the insulating layer 92.

It will be noted that, relative to the reference circuit, the thyristor thus formed under the transistors 1, 2 has a very much smaller turn-on time and overvoltage amplitude. Because its on-resistance is also very much smaller, the thyristor thus formed is able to dissipate a very large discharge power. Furthermore, such a thyristor makes it possible to maintain a high isolation performance for digital applications, in which supply voltages $V_{dd}$ are typically lower than 1.8 V.

In the embodiment illustrated in FIG. 1, the deep buried well 93 and the n-type semiconductor located under the implanted zone 18 form an effective guard ring for protecting the thyristor from untimely triggering. Specifically, electrons from the substrate are collected by the well 93, which is independent from the base of the bipolar transistors B1 and B2 formed. The well 93 also makes it possible to prevent current leaking from the well 94 into the substrate 91 in normal operation.

Figure 7:
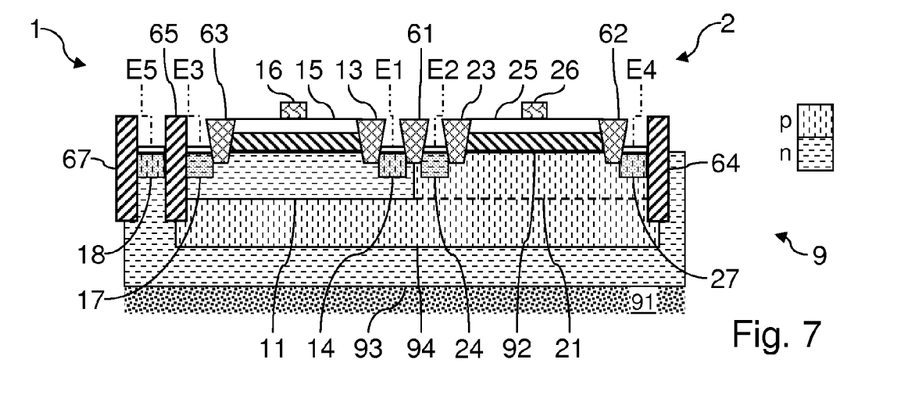
FIG. 7 is a cross-sectional view of an integrated-circuit portion according to a second variant of the first embodiment of the invention.

FIG. 7 is a cross-sectional view of an integrated circuit 9 according to a second variant of the first embodiment of the invention. Relative to the variant in FIGS. 1 and 2, the depths of the various trench isolations are identical, and the doping of the various implanted zones, ground planes and wells are identical.

The second variant differs from the first variant by the relative positions of the implanted zones 14, 24, of the trench isolations 13 and 23 and of the transistors 1, 2. The implanted zones 14, 17 are thus produced on either side of the transistor 1. The trench isolations 13, 63 are produced on the periphery of the transistor 1. The implanted zones 24, 27 are thus produced on either side of the transistor 2. The trench isolations 23 and 62 are produced on the periphery of the transistor 2. The trench isolation is produced between the implanted zones 14, 24.

Because of the smaller distance between the implanted zones 14, 24, this embodiment has an enhanced protection effectiveness with respect to electrostatic discharges.

Figure 8:
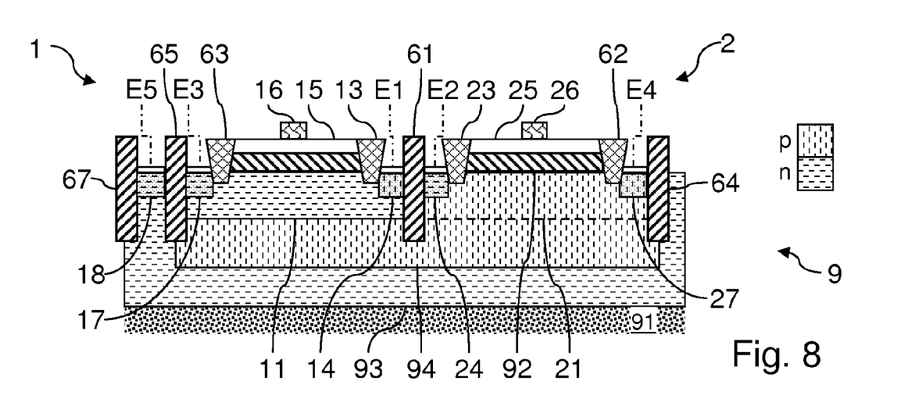
FIG. 8 is a cross-sectional view of an integrated-circuit portion according to a third variant of the first embodiment of the invention.

FIG. 8 is a cross-sectional view of an integrated circuit 9 according to a third variant of the first embodiment of the invention. In contrast to the embodiment shown in FIG. 7, the trench isolation 61 is replaced by a deep trench isolation. The trench isolation 61 has substantially the same depth as the trench isolations 62, 63, 65 and 67. Such a trench isolation 61 allows the sensitivity of the circuit 9 to untimely triggering to be decreased and enables a higher isolation withstand to high voltages (typically higher than 1.8 V).

Figure 9:
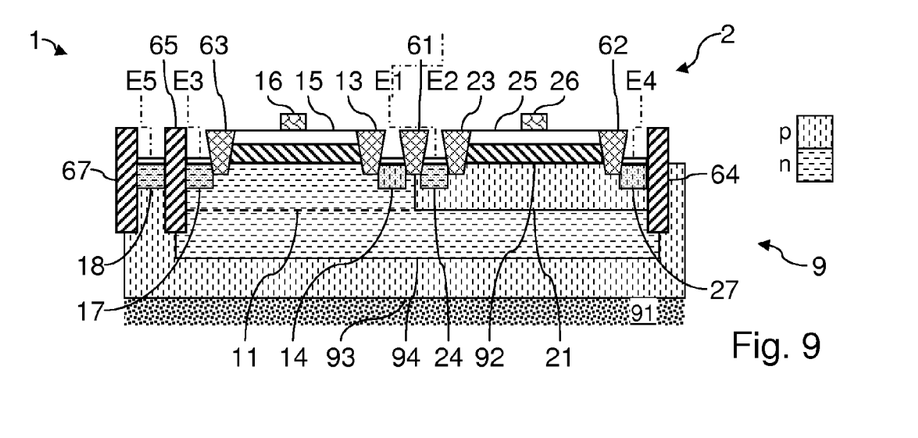
FIG. 9 is a cross-sectional view of an integrated-circuit portion according to a fourth variant of the first embodiment of the invention.

FIG. 9 is a cross-sectional view of an integrated circuit 9 according to a fourth variant of the first embodiment. The circuit 9 has substantially the same structure as the circuit in FIG. 7, except that the well 93 is p-doped, and the well 94 is n-doped.

Figure 10:
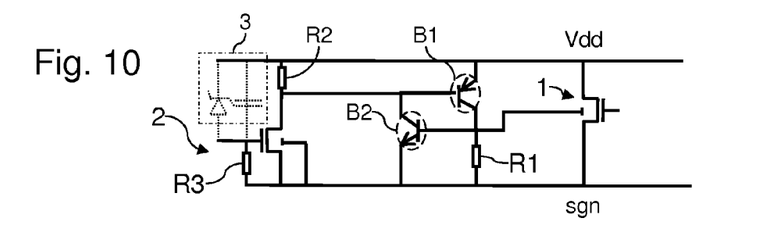
FIG. 10 is a circuit diagram of an example application of the integrated circuit in FIG. 1.

FIG. 10 is a circuit diagram of an example implementation of an integrated circuit according to the invention. The nMOS transistor 1 is here a circuit that must be protected by the first and second bipolar transistors B1 and B2. The source of the transistor 1 is connected to a supply potential $V_{dd}$ of the integrated circuit 9. The drain of the transistor 1 is connected to a potential of a signal Sgn. The ground plane 11 of the nMOS transistor 1 is connected to the base of the transistor B2.

The first and second bipolar transistors B1 and B2 here provide local protection of the nMOS transistor 1 from electrostatic discharges between the supply potential $V_{dd}$ and the signal Sgn. $V_{dd}$ is thus applied as the potential E1, and Sgn is applied as the potential E2. A resistor R1 is produced between the collector of B1, the base of B2 and the potential Sgn. A resistor R2 is produced between the base of B1, the collector of B2, and the potential $V_{dd}$.

The nMOS transistor 2 is a circuit for triggering the thyristor formed by the first and second bipolar transistors B1 and B2. The transistor 2 has its source connected to the potential Sgn, its drain connected to the collector of B2, and its ground plane 21 connected to the potential Sgn. A resistor R3 is formed between the gate of the transistor 2 and the potential Sgn.

When an electrostatic discharge occurs between the potentials $V_{dd}$ and Sgn, the thyristor formed by the transistors B1 and B2 is turned on by way of the transistor 2. The electrostatic discharge between the potentials $V_{dd}$ and Sgn is here short-circuited by the thyristor formed, thereby protecting the transistor 1.

The integrated circuit 9 may furthermore advantageously include an additional triggering circuit 3. The additional triggering circuit 3 illustrated includes a capacitor and a Zener diode connected in parallel between the gate of the transistor 2 and the potential $V_{dd}$.

The resistances of the resistors R1 and R2 may be well resistors, defined appropriately, for example by suitably choosing the depth of the trench isolations. The level of the floating voltages of the trigger signals of the thyristor formed may be defined by changing the distance separating the implanted zones 17, 24. The resistance of the resistor R3 will possibly be defined by an additional element.

The n-doped ground plane 11 forms a trigger of the thyristor. This ground plane may therefore be connected to a high potential in normal operation, or to a potential of a signal. The p-doped ground plane 21 also forms a trigger of the thyristor. This ground plane may therefore be connected to a low potential in normal operation, or to a potential of a signal.

Figure 11:
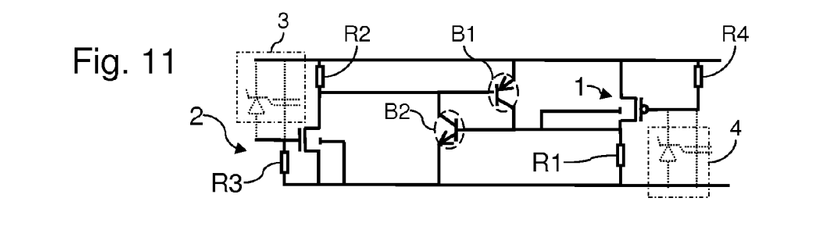
FIG. 11 is a circuit diagram of another example application of the integrated circuit in FIG. 1.

FIG. 11 is a circuit diagram of another example application of an integrated circuit according to the invention. In this embodiment, the first and second transistors 1, 2 are intended to trigger the first and send bipolar transistors B1, B2 formed, in order to provide centralized protection for other components, between the potentials E1 and E2. The transistor 2 has the same configuration detailed with reference to FIG. 3. In this embodiment, either the first transistor 1 or the second transistor 2 may apply a trigger signal turning the formed thyristor on. The circuit diagram illustrates additional triggering circuits 3, 4.

The n-doped ground plane 11 forms a trigger of the thyristor. This ground plane may therefore be connected to a high potential in normal operation, or to a potential of a signal. The p-doped ground plane 21 forms a trigger of the thyristor. This ground plane may therefore be connected to a low potential in normal operation, or to a potential of a signal.

Therefore, the ground planes 11, 21 of other transistors 1, 2 of the integrated circuit 9 may be biased to a desired potential with a minimum of limitations. Thus, it is possible to obtain the desired threshold voltage for the transistors of the integrated circuit 9.

Figure 12:
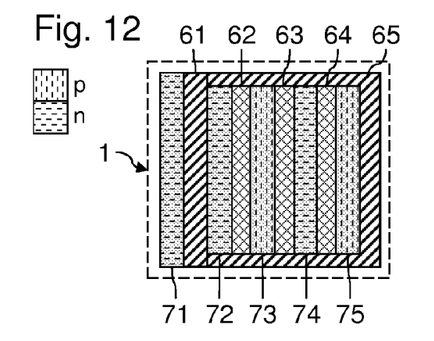
FIG. 12 is a schematic top view of an integrated-circuit portion according to a first variant of the second embodiment of the invention.
Figure 13:
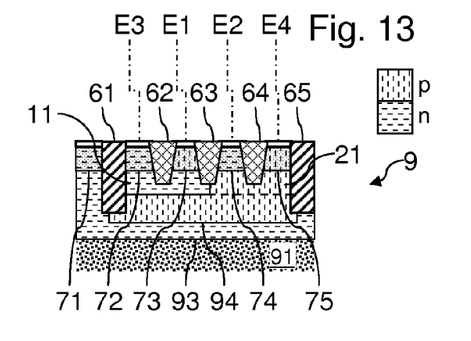
FIG. 13 illustrates a cross-sectional view of the integrated circuit in FIG. 12.

FIG. 12 is a schematic top view of a portion of an integrated circuit 9 fabricated on SOI, according to a first variant of a second embodiment. FIG. 13 is a cross-sectional view of the integrated circuit 9 in FIG. 12. This integrated-circuit portion here forms an SCR protecting device, the structure of which is detailed below. The integrated circuit 9 comprises other electronic components produced on a buried insulating layer. These are of a conventional nature and are therefore not illustrated.

The integrated circuit 9 is formed plumb with a semiconductor substrate 91. This substrate 91 is p-doped. An n-doped deep buried well 93 is produced in the substrate 91. A p-doped well 94 is produced in the well 93. An n-doped first semiconductor element 11 is produced in the well 94. A p-doped semiconductor element 21 is produced in the well 94.

Moreover, an n+-doped implanted zone 71 is produced for biasing the deep buried well 93. The deep buried well 93 thus allows the well 94 to be isolated from the substrate 91. An implanted zone 72, advantageously n+-doped, is produced on the semiconductor element 11. An n+-doped implanted zone 74 is produced on the semiconductor element 21. An implanted zone 75, advantageously p+-doped, is produced on the semiconductor element 21. An implanted zone 73, advantageously p+-doped, is produced on the semiconductor element 11 between the implanted zones 72, 74.

The integrated circuit 9 comprises trench isolations of various depths. Trench isolations 61, 65 extend in the depth direction as far as into the well 94. The trench isolations 61, 65 do not reach the bottom of the well 94.

The integrated circuit 9 comprises a trench isolation 62 extending in the depth direction as far as the semiconductor element 11 without reaching the well 94. The trench isolation 62 separates the implanted zones 72, 73. Thus, the semiconductor element 11 forms a continuous semiconductor connection between the implanted zones 72, 73. The integrated circuit 9 comprises a trench isolation 63 extending in the depth direction as far as the semiconductor elements 11, 21, without reaching the well 94. The trench isolation 63 is therefore arranged plumb with an interface between the semiconductor elements 11, 21. The trench isolation 63 separates the implanted zones 73, 74. The integrated circuit 9 comprises a trench isolation 64 extending in the depth direction as far as the semiconductor element 21 without reaching the well 94.

The trench isolation 64 separates the implanted zones 74, 75. Thus, the semiconductor element 21 forms a continuous semiconductor connection between the implanted zones 74, 75.

The implanted zone 73 is biased to a first voltage level E1, the implanted zone 74 is biased to a second voltage level E2, the implanted zone 72 is biased to a third voltage level E3 and the implanted zone 75 is biased to a fourth voltage level E4. Bipolar transistors B1 and B2 are formed to obtain a device for protecting from electrostatic discharges.

The bipolar transistor B1 is a pnp transistor and the transistor B2 is an npn transistor.

For the bipolar transistor B1, the emitter is formed by the implanted zone 73, and is at the potential E1, the base is formed by the ground plane 11, and is at potential E3, and the collector is formed by the well 94 and the ground plane 21, and is at the potential E4.

For the bipolar transistor B2, the emitter is formed by the implanted zone 74, and is at the potential E2, the base is formed by the well 94 and the ground plane 21, and is at the potential E4; and the collector is formed by the ground plane 11, and is at the potential E3.

A thyristor potentially having two triggers is thus formed, between the potentials E1, E2, the signals E3, E4 possibly being applied to the two triggers of this thyristor.

Thus, bipolar transistors are formed, the respective bases of which are laterally offset from their collector and emitter. The semiconductor element 21 thus separates the implanted zone 74 from the well 94 and the element 11. Here, the bases have a large area of contact with the collectors and are produced under trench isolations 62, 64 that are shallower than the trench isolations 61, 65. Here, the bases comprise respective thin semiconductor elements 11, 21. The trench isolations 62, 64 typically have a width that is about the same as that of the technological node. The illustrated implanted zones 71-75 extend to a smaller depth than the trench isolations 62-64. However, it may also be envisioned for the implanted zones 71-75 to extend to a larger depth than the trench isolations 62-64. The implanted zones may for example extend as much as 50 nm under the buried insulating layer present in other zones of the integrated circuit 9, or as much as 50 nm under the trench isolations 62-64. The bottom of the implanted zones may also be positioned above the top surface of the buried insulating layer present in the rest of the integrated circuit 9.

Such a device for protecting from electrostatic discharges substantially increases switching speed and the power that can be dissipated during a discharge. Because most of the structure of this protecting device is arranged under the implanted zones, this device has a small footprint.

The combination of the trenches 62, 63 and of the implanted zone 73 is used to produce an isolation between the implanted zones 72, 74. Thus, it is possible to define a distance isolating the implanted zones 72, 74, typically 40 nm for a 20 nm technology node, with a high degree of precision, relative to using a single trench isolation to isolate the implanted zones 72, 74. The thickness of the ground plane 11 under the trench 62, i.e. the distance between the trench 62 and the well 94, is advantageously between 20 and 200 nm.

The trench isolations 62-64 here advantageously have the same depth. The trench isolations 62-64 for example extend between 5 and 50 nm under the top surface of the implanted zones. The trench isolations 62 to 64 may also advantageously extend between 5 and 50 nm under the buried insulating layer of the integrated circuit 9. The trench isolations 62-64 are less deep than the trench isolations 61, 65. The bottom of the buried insulating layer is here level with the top surface of the implanted zones 71-75.

The well 94 may have a dopant concentration comprised between $10^{16}$ cm$^{-3}$ and $10^{18}$ cm$^{-3}$. The well 94 may extend as far as a depth smaller than 1 µm and, preferably, smaller than or equal to 700 nm.

Advantageously, the implanted zones 71-75 each have a dopant concentration at least five times, or one hundred times higher than the dopant concentration of the well 94. For example, these implanted zones advantageously have dopant concentrations higher than or equal to $5 \times 10^{18}$ cm$^{-3}$ and, preferably, between $10^{19}$ cm$^{-3}$ and $10^{21}$ cm$^{-3}$.

Figure 14:
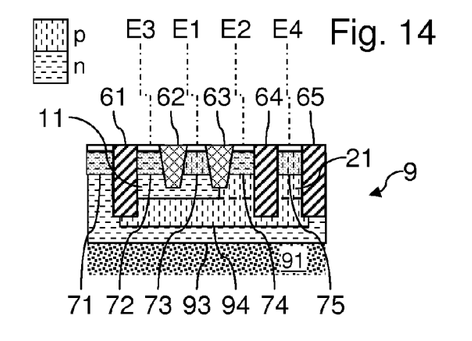
FIG. 14 is a cross-sectional view of an integrated-circuit portion according to a second variant of the second embodiment of the invention.

FIG. 14 is a cross-sectional view of an integrated circuit 9 fabricated on SOI according to a second variant of the second embodiment. Compared with the embodiment shown in FIG. 12, the embodiment of FIG. 14 differs by the depth of the trench isolation 64. The trench isolation 64 extends as far as into the well 94, under the semiconductor element 21. This increases the immunity of the transistor 1 to parasitic turn-on.

Figure 15:
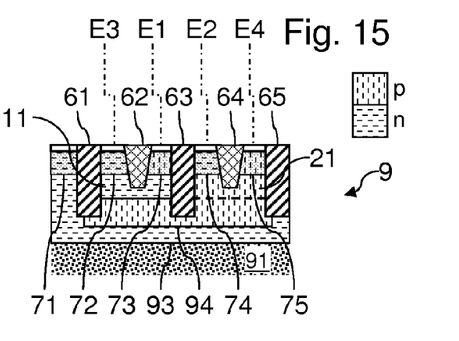
FIG. 15 is a cross-sectional view of an integrated-circuit portion according to a third variant of the second embodiment of the invention.

FIG. 15 is a cross-sectional view of an integrated circuit 9 fabricated on SOI according to a third variant of the second embodiment. Compared with the embodiment shown in FIG. 12, this second embodiment differs by the depth of the trench isolation 63. The trench isolation 63 extends as far as into the well 94, under the semiconductor element 21. This embodiment increases immunity of the transistor 1 to parasitic turn-on.

Figure 16:
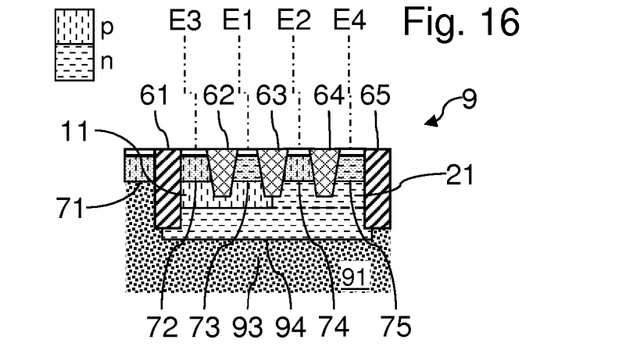
FIG. 16 is a cross-sectional view of an integrated-circuit portion according to a fourth variant of the second embodiment of the invention.

FIG. 16 is a cross-sectional view of an integrated circuit 9 fabricated on SOI, according to a fourth variant of the second embodiment. Unlike the embodiment shown in FIG. 12, the well 94 is n-doped and the integrated circuit 9 does not comprise the deep buried well 93. The implanted zones 72 to 74 and the semiconductor elements 11, 21 are identical to those in FIG. 12.

Figure 17:
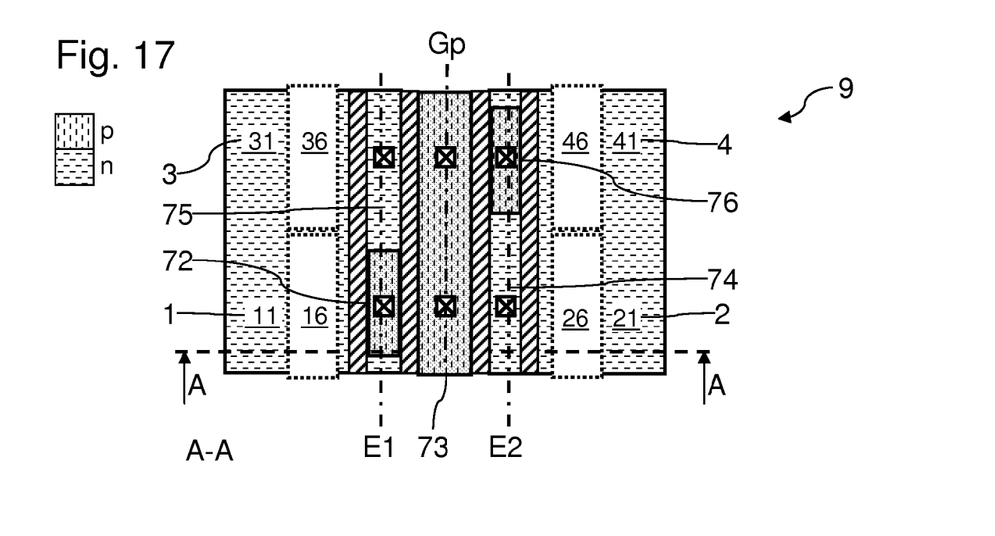
FIG. 17 is a schematic top view of an integrated-circuit portion according to a first variant of a third embodiment of the invention.
Figure 18:
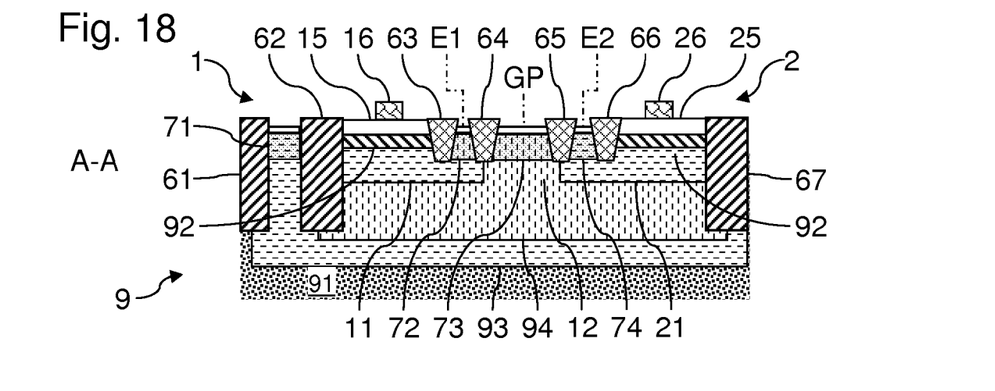
FIG. 18 illustrates a cross-sectional view of the integrated circuit in FIG. 17.

FIG. 17 is a schematic sectional top view, level with the implanted zone, of a portion of an integrated circuit 9 fabricated on SOI according to a first variant of a third embodiment. The integrated circuit 9 here, comprises a first cell comprising first and second electronic components 1, 2, and a second cell comprising third and fourth electronic components 3, 4. FIG. 18 is a cross-sectional view level with the first cell.

The electronic components 1-4 are produced in a layer of a semiconductor, called the active layer, formed on an insulating layer 92. This insulating layer 92 is formed plumb with a p-doped semiconductor substrate 91.

The electronic components 1-4 are in this case FDSOI field-effect transistors. The components 1-4 may also be field-effect diodes (FEDs), field-effect rectifiers (FERs), or Z2-FETs.

The first and third transistors 1, 3 are, for example, nMOS transistors and the second and forth transistors 2, 4 are, for example, pMOS transistors. The transistors are generally aligned in a row of cells each of which includes an nMOS transistor and a pMOS transistor. The nMOS transistors of the various cells are thus aligned.

The transistors 1-4 comprise a source, a drain and a channel, and a gate multilayer produced plumb with the channel. The source, the drain and the channel of the transistors 1-4 are respectively produced in first and second active semiconductor layers 15, 25 for the first and second transistors 1, 2, respectively. The transistors 1-4 comprise respective gate multilayers (16 and 26 for the transistors 1, 2, respectively) respectively arranged on the active semiconductor layers, plumb with the channel. In order to simplify the drawings, the detailed structure of the active layers has not been shown. The transistors of the active layer may comprise a channel made of a weakly-doped semiconductor having a dopant concentration substantially equal to the dopant concentration of the substrate 91. The transistors 1-4 also comprise respective source and drain electrodes (not illustrated).

Semiconductor ground planes 11, 21, 31 and 41 are formed plumb with the transistors 1-4, respectively, under the buried insulating layer 92. The ground planes 11, 21, 31 and 41 are n-doped.

The ground planes 11, 21, 31, 41 are respectively biased by implanted semiconductor zones 74 and 75. The implanted zones 72, 74, 75, 76 are p-doped, n-doped, n-doped and p-doped, respectively (and preferably p+-doped, n+-doped, n+-doped and p+-doped, respectively). The ground planes may be biased by way of a control circuit (not shown). An implanted zone 73 (preferably p+-doped) is formed in the middle part of the circuit 9. An implanted zone 71 (preferably n+-doped) is produced to the side.

A semiconductor well 94 is formed plumb with the ground planes 11, 21, 31, 41. Part of the well 94 forms a separation between the ground planes 11, 21, and a separation between the wells 31, 41. Thus, the well 94 comprises a part 12 arranged under the implanted zone 73 and making contact with this implanted zone 73. The part 12 of the well 94 is coplanar with the ground planes 11, 21, 31, 41, i.e. a plane parallel to the insulating layer 92 may pass through these elements. The implanted zone 73 is used to bias the well 94. The well 94 is p-doped. The well 94 is produced in a deep buried well 93. The deep buried well 93 is n-doped and biased via an implanted zone 71. The well 93 forms a separation between the well 94 and the p-doped substrate 91.

The buried insulating layer 92 electrically isolates the transistors 1-4 from their respective ground plane, from the well 94, and from the substrate 91. The buried insulating layer 92 formed plumb with the transistors is here an ultra-thin buried oxide (UTBOX) layer. Thus, control of the bias of the ground planes 11, 21, 31, 41 allows the respective threshold voltages of the transistors 1-4 to be modulated. The insulating layer 92 has a thickness smaller than or equal to 60 nm, smaller than or equal to 50 nm, or even smaller than or equal to 20 nm. The insulating layer 92 may be produced from silicon oxide.

Deep trench isolations 62 and 67 are produced on the periphery of each of the transistors 1-4. A trench isolation 61 is produced laterally relative to the transistors. The trench isolations 61, 62 and 67 extends in the depth direction through the insulating layer 92, as far as into the well 94, without reaching the bottom of the well 94.

The transistors 1 and 3 furthermore comprise trench isolations 63, 64. The transistors 2, 4 furthermore comprise trench isolations 65, 66.

The trench isolations 63, 64 extend as far as into the ground planes 11, 31, without reaching the bottom of these ground planes. The trench isolations 65, 66 extend as far as into the ground planes 21, 41, without reaching the bottom of these ground planes. The trench isolation 64 is arranged plumb with the interface between the part 12 and the ground planes 11, 31. The trench isolation 65 is arranged plumb with the interface between the part 12 and the ground planes 21, 41. The trench isolations 63-66 are thus shallower than the trench isolations 61, 62, and 67.

The implanted zones 72 to 76 are produced laterally relative to the transistors 1-4. The implanted zone 71 is produced between the trench isolations 61 and 62. The transistor 1 is produced between the trench isolations 62 and 63. The implanted zone 72 is arranged between the trench isolations 63 and 64. The implanted zone 73 is produced between the trench isolations 64 and 65. The implanted zone 74 is produced between the trench isolations 65 and 66. The transistor 2 is produced between the trench isolations 66 and 67.

The implanted zones 72 and 75 are biased to a first voltage level E1. The implanted zones 74 and 76 are biased to a second voltage level E2, different from E1. A device for protecting against electrostatic discharges is included in the integrated circuit 9. The protection from electrostatic discharges aims to provide protection from discharges between the voltage levels E1 and E2. The device for protecting from electrostatic discharges here comprises the implanted zone 73 and the part 12. A trigger potential Gp may be applied to the well 94 by way of the implanted zone 73 and the part 12.

In the first cell, the protecting device includes bipolar transistors B1 and B2. The bipolar transistor B1 is a pnp transistor and the transistor B2 is an npn transistor.

For the transistor B1, the emitter is formed by the implanted zone 72, and is at the potential E1; the base is formed by the ground plane 11; and the collector is formed by the well 94, the part 12 and the implanted zone 73, and is at the potential Gp.

For the transistor B2: the emitter is formed by the implanted zone 74 and the ground plane 21, and is at the potential E2; the base is formed by the well 94, the part 12 and the implanted zone 73, and is at the potential Gp; and the collector is formed by the ground plane 11, and is at the potential E1.

In the second cell, the protecting device includes bipolar transistors B3 and B4. The bipolar transistor B3 is an npn transistor and the transistor B4 is a pnp transistor.

For the transistor B3: the emitter is formed by the implanted zone 75 and the ground plane 31, and is at the potential E1; the base is formed by the well 94, the part 12 and the implanted zone 73, and is at the potential Gp; and the collector is formed by the ground plane 41, and is at the potential E2.

For the transistor B4: the emitter is formed by the implanted zone 76, and is at the potential E2; the base is formed by the ground plane 41; and the collector is formed by the well 94, the part 12 and the implanted zone 73, and is at the potential Gp.

A thyristor is moreover formed by the implanted zone 72, the ground plane 11, the well 94 and the deep buried well 93. Another thyristor is formed by the implanted zone 76, the ground plane 41, the well 94, and the deep buried well 93.

As for the preceding embodiments, this embodiment allows turn-on time and overvoltage amplitude during an electrostatic discharge to be substantially decreased. Furthermore, this embodiment provides sufficient isolation quality for digital applications with supply voltages typically lower than 1.8 V.

Figure 19:
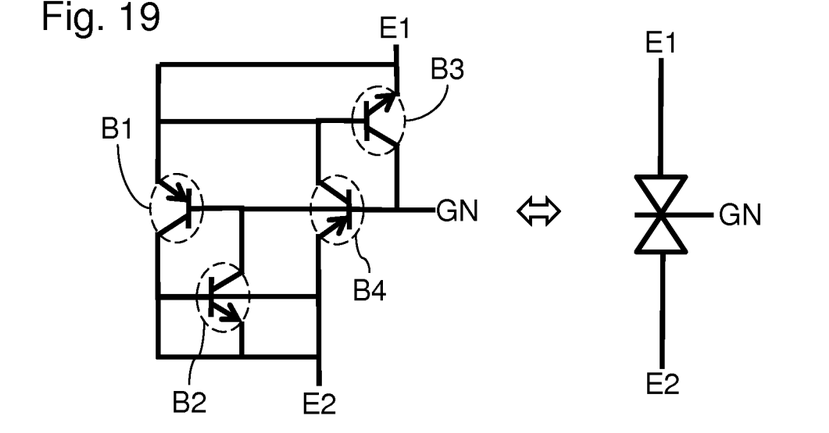
FIG. 19 is an equivalent circuit diagram of a finished protecting device.

FIG. 19 illustrates an equivalent circuit diagram showing that the combination of transistors B1 to B4 forms a triac: specifically, the transistors B1 and B2 form a first thyristor and B3 and B4 form a second thyristor; these thyristors being back-to-back, a triac is obtained. The implanted zone 73, the part 12, and the well 94 thus form a trigger of the triac formed in the integrated circuit 9. The trigger of the triac is thus controlled by the signal Gn.

The implanted zones 72, 74, 75 and 76 intended to bias the ground planes 11, 21, 31, 41 are used to form the triac. A particularly simple and inexpensive protecting device may thus be formed.

The triac thus allows protection to be provided from electrostatic discharges between the potentials E1 and E2, whatever the polarity of the discharge. The potentials E1 and E2 may for example be set to $V_{dd}$ and ground, respectively. The triac thus formed is essentially located under the transistors 1-4 and therefore affects only marginally the integration density of the integrated circuit.

Figure 20:
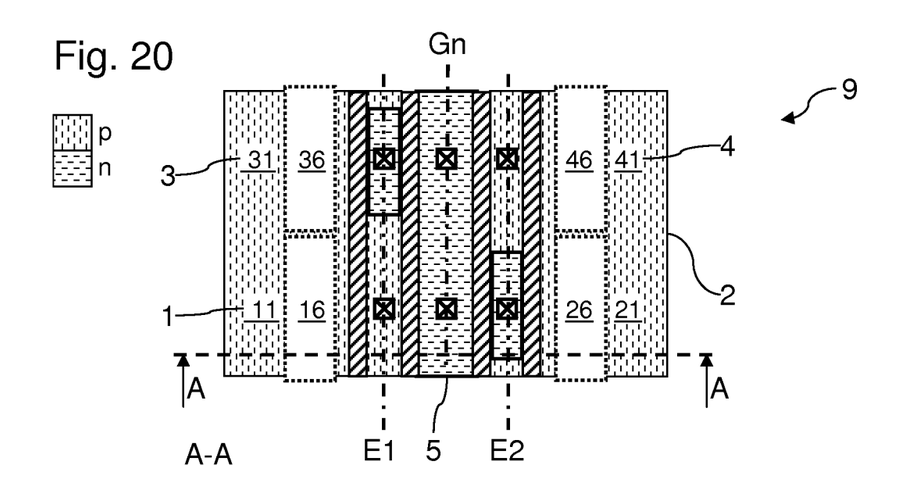
FIG. 20 is a schematic top view of an integrated-circuit portion according to a second variant of the third embodiment of the invention.
Figure 21:
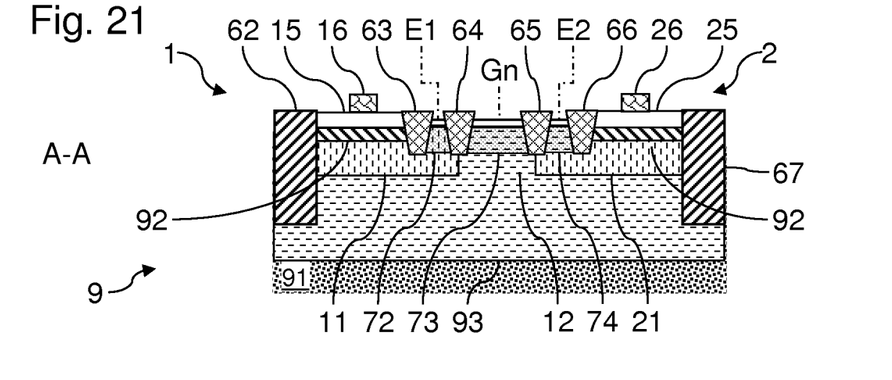
FIG. 21 illustrates a cross-sectional view of the integrated circuit in FIG. 19.

FIG. 20 is a schematic sectional top view (level with the implanted zones) of a portion of an integrated circuit 9 fabricated on SOI according to a second variant of the third embodiment. The circuit 9 has substantially the same structure as the circuit in FIG. 17, except for the following differences: the well 94 is n-doped; the ground planes 11, 21, 31, 41 are p-doped; the part 12 is n-doped; the implanted zone 73 is n+-doped and biased with a voltage Gn; and the circuit 9 does not comprise the deep buried well 93, the implanted zone 71 and the trench isolation 61.

In the examples illustrated in FIGS. 17 and 20, the trenches 64 and 65 are shallower. However, it may also be envisioned for these trenches 64 and 65 to extend into the well 94, beyond the bottom of the ground planes 11, 21, 31, 41.

[The examples of FIGS. 17 and 20 illustrate a triac integrated under electronic components 1-4. However, it may also be envisioned to produce a stand-alone triac not having electronic components above it.

The activating signal (Gn or Gp) of a protecting device 83 may be generated by a known circuit for detecting an electrostatic discharge. The protecting device 83 may be intended to locally protect first and second cells 81 and 82 produced plumb with it, or intended to form a centralized protection of the integrated circuit 9.

Figure 22:
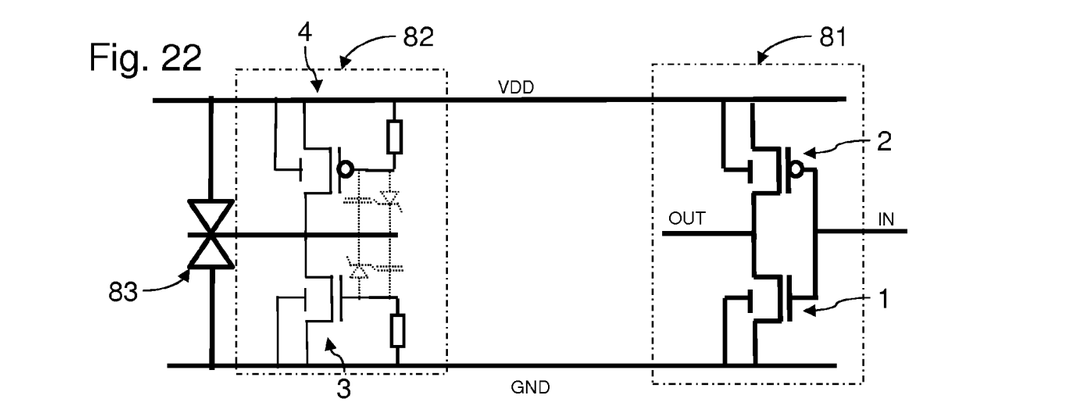
FIGS. 22 and 23 are equivalent circuit diagrams in which circuits according to the third embodiment are used.

FIG. 22 schematically illustrates an example in which a protecting device 83 (such as that in FIG. 17) provides local protection of a first cell 81. Here, the first cell is a complementary metal oxide semiconductor (CMOS) inverter 81. The inverter 81 has an input IN configured to receive an input logic signal, and an output OUT configured to return a corresponding logic signal of opposite logic to the input signal. The inverter 81 may especially be used as an input/output interface of the integrated circuit 9. The protecting device 83 here provides protection from electrostatic discharges between a supply rail at $V_{dd}$; and a grounded supply rail. In this example: the respective gates of the FDSOI transistors 1, 2 of the first cell are electrically connected together and to the input IN; the respective drains of the transistors 1, 2 are electrically connected together and electrically connected to the output OUT; the sources of the transistors 1, 2 are electrically biased to a ground GND and a supply voltage VDD of the integrated circuit 9, respectively; and the ground planes of the transistors 1, 2 are electrically biased to the ground GND and the supply voltage VDD of the integrated circuit 9, respectively. The ground planes of the transistors 1, 2 are n-doped; and the substrate 91 is electrically connected to ground GND.

The second cell 82 forms a triggering circuit of the protecting device 83 (such as that in FIG. 20). The FDSOI nMOS transistor 3 has its gate electrically connected to ground GND by way of a resistor. The ground plane of the transistor 3 is connected to ground GND and is p-doped. The source of the transistor 3 is connected to ground GND. The drain of the transistor 3 is connected to the trigger of the triac of the protecting device 83. The pMOS transistor 4 has its gate electrically connected to the supply voltage $V_{dd}$ by way of a resistor. The ground plane of the transistor 4 is connected to the voltage $V_{dd}$ and is p-doped. The source of the transistor 4 is connected to the voltage $V_{dd}$. The drain of the transistor 4 is connected to the trigger of the triac.

Depending on the polarity of an electrostatic discharge between the supply $V_{dd}$ and ground Gnd rails, either the transistor 3 or the transistor 4 turns on and triggers the triac. The triac is turned on, and the electrostatic discharge between the supply $V_{dd}$ and ground Gnd rails passes through the triac, the first cell 81 thus being protected from this discharge.

Figure 23:
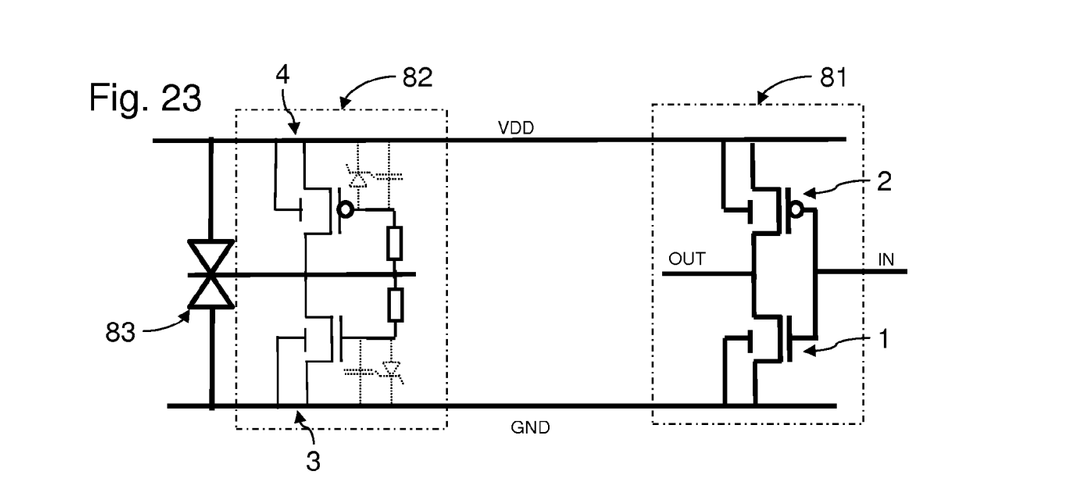

FIG. 23 schematically illustrates an example in which the protecting device 83 (such as that in FIG. 18) provides local protection of the first cell 81. The first cell 81 is here identical to that in FIG. 22, except for the fact that the ground planes of the transistors 1, 2 are n-doped.

The second cell 82 forms a circuit for triggering the protecting device 83. The nMOS transistor 3 has its gate electrically connected to the trigger of the triac by way of a resistor. The ground plane of the transistor 3 is connected to ground GND and is n-doped. The source of the transistor 3 is connected to ground GND. The drain of the transistor 3 is connected to the trigger of the triac of the protecting device 83. The pMOS transistor 4 has its gate electrically connected to the trigger of the triac by way of a resistor. The ground plane of the transistor 4 is connected to the potential $V_{dd}$ and is n-doped. The source of the transistor 4 is connected to the voltage $V_{dd}$. The drain of the transistor 4 is connected to the trigger of the triac.

Depending on the polarity of an electrostatic discharge between the supply $V_{dd}$ and ground Gnd rails, either the transistor 3 or the transistor 4 turns on and triggers the triac. The triac is turned on, and the electrostatic discharge between the supply $V_{dd}$ and ground Gnd rails passes through the triac, the first cell 81 thus being protected from this discharge.

In the example applications in FIGS. 22 and 23, the anode and the cathode of the triac of the protecting device 83 have the same doping type. Thus, a high design flexibility is obtained while minimizing limitations on the voltages used to bias the ground planes of the transistors 1-4. It is thus possible to obtain the threshold voltage desired for the FDSOI transistors 1-4 of the integrated circuit 9.

Having described the invention, and a preferred embodiment thereof, what is claim as new, and secured by Letters Patent is:

1. A manufacture comprising an integrated circuit arranged on and in a p-doped substrate, said integrated circuit comprising a bipolar transistor for protecting from electrostatic discharges, an n-doped first semiconductor element, a p-doped well, a deep buried n-doped well, an n-doped first implanted zone, a p-doped second implanted zone, a p-doped third implanted zone, a fourth implanted zone, a first trench isolation, a second trench isolation, and a third trench isolation, wherein said n-doped first semiconductor element comprises a bottom, wherein said n-doped first implanted zone is arranged on said first semiconductor element, wherein said n-doped first implanted zone forms, with said n-doped first semiconductor element, a base of said bipolar transistor, wherein said p-doped second implanted zone forms an emitter of said bipolar transistor, wherein said p-doped second implanted zone is arranged on said n-doped first semiconductor element, wherein said p-doped well is arranged in said deep buried n-doped well, wherein said p-doped well is arranged under said n-doped first implanted zone and said p-doped second implanted zone, wherein said p-doped well makes contact with said bottom of said n-doped first semiconductor element, wherein said p-doped well has a top part, wherein said p-doped third implanted zone is arranged on said p-doped well, wherein said p-doped third implanted zone forms, with said p-doped well, a collector of said bipolar transistor, wherein said fourth implanted zone is arranged in said top part, wherein said first trench isolation separates said first and second implanted zones, wherein said first trench isolation extends into said n-doped first semiconductor element by an amount equal to a first depth, wherein said first trench isolation extends into said n-doped first semiconductor element without reaching said bottom of said n-doped first semiconductor element, wherein said second trench isolation extends as far as below said n-doped first semiconductor element, and wherein said third trench isolation separates said third and fourth implanted zones and extends to a depth equal to said first depth.

2. The manufacture of claim 1, wherein said p-doped second implanted zone is separated from said p-doped well by a thickness of said n-doped first semiconductor element, wherein said thickness is between 20 and 150 nm.

3. The manufacture of claim 1, wherein said p-doped well makes contact with an entirety of said bottom of said n-doped first semiconductor element.

4. The manufacture of claim 1, wherein said first and second implanted zones extend into said first semiconductor element to a depth larger than the first depth of said first trench isolation.

5. The manufacture of claim 1, wherein said first trench isolation extends to the first depth between 5 and 50 nm into said n-doped first semiconductor element.

6. The manufacture of claim 1, further comprising a first electronic component, a second electronic component, an ultra-thin buried oxide (UTBOX) insulating layer, a first ground plane, and a second ground plane, wherein said buried UTBOX insulating layer is arranged under said first electronic component, wherein said buried UTBOX insulating layer is arranged under said second electronic component, wherein said buried UTBOX insulating layer is plumb with said first electronic component, wherein said buried UTBOX insulating layer is plumb with said second electronic component, wherein said n-doped first implanted zone passes through said buried insulating layer, wherein said second implanted zone passes through said buried insulating layer, wherein said third implanted zone passes through said buried insulating layer, wherein said first ground plane is arranged plumb with said first electronic component under said buried insulating layer, wherein said second ground plane is arranged plumb with said second electronic component under said buried insulating layer, wherein said first semiconductor element forms said first ground plane, wherein said top part of said p-doped well forms said second ground plane, wherein said p-doped second implanted zone is suitable for connection to a first biasing voltage, wherein said third implanted zone is suitable for connection to a second biasing voltage, and wherein said first biasing voltage is different from said second biasing voltage.

7. The manufacture of claim 6, wherein said n-doped first implanted zone and said p-doped second implanted zone are arranged on either side of said transistor.

8. The manufacture of claim 1, wherein said second implanted zone is arranged between said first and third implanted zones.

* * * * *